US008824975B2

(12) United States Patent
Sato et al.

(10) Patent No.: US 8,824,975 B2
(45) Date of Patent: Sep. 2, 2014

(54) RADIO COMMUNICATION DEVICE AND RADIO COMMUNICATION METHOD

(75) Inventors: Junji Sato, Tokyo (JP); Suguru Fujita, Tokyo (JP)

(73) Assignee: Panasonic Corporation, Osaka (JP)

( * ) Notice: Subject to any disclaimer, the term of this patent is extended or adjusted under 35 U.S.C. 154(b) by 216 days.

(21) Appl. No.: 13/318,416

(22) PCT Filed: Feb. 23, 2011

(86) PCT No.: PCT/JP2011/001030
§ 371 (c)(1),
(2), (4) Date: Nov. 1, 2011

(87) PCT Pub. No.: WO2011/108228
PCT Pub. Date: Sep. 9, 2011

(65) Prior Publication Data
US 2012/0052819 A1   Mar. 1, 2012

(30) Foreign Application Priority Data

Mar. 2, 2010  (JP) ................. 2010-045479

(51) Int. Cl.
| H04B 1/44 | (2006.01) |
| H04L 25/49 | (2006.01) |
| H04L 5/16 | (2006.01) |
| H04B 1/00 | (2006.01) |
| H03F 3/24 | (2006.01) |
| H03F 3/60 | (2006.01) |
| H03F 1/32 | (2006.01) |
| H04B 1/04 | (2006.01) |

(52) U.S. Cl.
CPC .............. *H04B 1/0475* (2013.01); *H03F 3/245* (2013.01); *H03F 3/604* (2013.01); *H04B 2001/0433* (2013.01); *H03F 1/3247* (2013.01)
USPC .......................................................... 455/78

(58) Field of Classification Search
USPC .......... 455/78, 80, 114.3, 126, 295, 501, 506, 455/63.1, 67.11, 67.13, 67.16, 115.1
See application file for complete search history.

(56) References Cited

U.S. PATENT DOCUMENTS 5,862,181 A    1/1999  Ishizuka
6,640,110 B1 * 10/2003 Shapira et al. ............. 455/562.1
(Continued)

FOREIGN PATENT DOCUMENTS

CN         1131848 A     9/1996
JP       2007214957 A    8/2007
(Continued)

OTHER PUBLICATIONS

International Search Report for PCT/JP2011/001030, mailed Mar. 29, 2011, 2 pages.

*Primary Examiner* — Edward Urban
*Assistant Examiner* — Ralph H Justus
(74) *Attorney, Agent, or Firm* — Seed IP Law Group PLLC

(57) ABSTRACT

It is provided a radio communication apparatus and radio communication method that, in the radio communication apparatus having a normal transmitting/receiving mode and a distortion correction mode, communicates successfully without influencing circuit characteristic in a normal transmitting/receiving mode, sends back a transmitting signal from the receiving system, extracts a distortion component due to narrowband characteristics or non-linear characteristics of a circuit, and corrects distortion in a distortion correction mode. In radio communication apparatus (100), distortion detecting section (111) extracts a distortion component using a transmitting baseband signal and a receiving baseband signal, coupling degree adjustment circuit (180) adjusts the degree of coupling between transmitting antenna (130) and receiving antenna (140), and coupling degree control section (170) switches the degree of coupling depending on a normal transmitting/receiving mode or a distortion correction mode.

18 Claims, 11 Drawing Sheets

(56) References Cited

U.S. PATENT DOCUMENTS

| | | | |
|---|---|---|---|
| 7,502,592 B2* | 3/2009 | Yamamoto et al. | 455/63.1 |
| 7,679,514 B2* | 3/2010 | Rofougaran et al. | 340/572.2 |
| 7,907,924 B2* | 3/2011 | Kawasaki | 455/252.1 |
| 8,340,214 B2* | 12/2012 | Kang et al. | 375/297 |
| 8,351,492 B2* | 1/2013 | Ly-Gagnon | 375/221 |
| 2002/0113648 A1* | 8/2002 | Miyaji et al. | 330/151 |
| 2004/0111681 A1* | 6/2004 | Lu et al. | 716/1 |
| 2005/0164656 A1* | 7/2005 | Watabe et al. | 455/114.3 |
| 2006/0178120 A1* | 8/2006 | Puma | 455/114.3 |
| 2006/0178165 A1* | 8/2006 | Vassiliou et al. | 455/552.1 |
| 2008/0280574 A1* | 11/2008 | Rofougaran et al. | 455/126 |
| 2008/0287076 A1* | 11/2008 | Shen et al. | 455/114.3 |
| 2009/0033467 A1* | 2/2009 | Finocchiaro et al. | 340/10.1 |
| 2009/0207935 A1* | 8/2009 | Behzad | 375/296 |
| 2010/0231452 A1* | 9/2010 | Babakhani et al. | 342/368 |
| 2011/0076944 A1* | 3/2011 | Mihota | 455/41.2 |
| 2011/0115565 A1* | 5/2011 | Cabanillas | 330/307 |

FOREIGN PATENT DOCUMENTS

| | | |
|---|---|---|
| JP | 2007295331 A | 11/2007 |
| JP | 200955378 A | 3/2009 |

* cited by examiner

| | PA OPERATION MODE | LNA OPERATION MODE | SWITCH |
|---|---|---|---|
| IN NORMAL TRANSMITTING/ RECEIVING MODE | — | — | ON |
| IN DISTORTION CORRECTION MODE | High | High | ON |
| | High | Low | OFF |
| | Low | High | OFF |
| | Low | Low | OFF |

FIG.4

RADIO COMMUNICATION DEVICE AND RADIO COMMUNICATION METHOD

TECHNICAL FIELD

The present invention mainly relates to a technique of correcting distortion component due to frequency characteristics or non-linear characteristics that a circuit of a radio communication apparatus mainly including an information terminal has. More particularly, the present invention relates to a radio communication apparatus and radio communication method for use in a millimeter waveband.

BACKGROUND ART

In recent years, making a radio frequency (RF) circuit to be a monolithic microwave integrated circuit (MMIC) has been underway in a radio communication field using a millimeter waveband. However, since device capacity is poor in an ultra high frequency band such as a millimeter waveband, it is necessary to apply more current to make circuit characteristics having at least one of linear characteristics or frequency characteristics good, and power consumption tends to increase.

Meanwhile, there is also a trend to mount an RF circuit of a millimeter waveband on a compact portable information terminal. Therefore, an RF circuit of a millimeter waveband is required to lower power consumption, but once power consumption is lowered, at least one of the above described frequency characteristics and linear characteristics of a circuit is deteriorated. In order to achieve good communication, a distortion correction technique to correct a distortion component due to frequency characteristics or non-linear characteristics is necessary.

A configuration to provide a coupler in the final phase of the transmitting circuit of the receiving system to extract a transmitting signal, and to provide switches in the first phase of the receiving system to switch the extracted transmitting signal and the actually received signal, has been proposed as a distortion correction technique (for example, see patent literature 1).

FIG. 1 is a schematic configuration diagram of a conventional radio apparatus shown in patent literature 1. This radio apparatus is a multiband and multimode transmitting/receiving device supporting multiple frequency bands and multiple modulation schemes where modulation scheme A and modulation scheme B are mounted. This will be described using one modulation scheme A transmitting system and one modulation scheme B receiving system.

With radio apparatus 10, the transmitting system has a configuration to include pre-distortion section 11 that compares an input signal and a fed back signal and compensates for distortion, digital-to-analog (D/A) conversion 12 that converts a digital signal to an analog signal, modulating section 13 that converts a signal of low frequency component produced by D/A conversion 12 into a high frequency signal, power amplifier (PA) 14 that amplifies a high frequency signal to a desired power level, and coupler (CUP) 15 that takes out part of an amplified signal.

With radio apparatus 10, the receiving system has a configuration to include switch (SW) 16 that switches passing signals, low noise amplifier (LNA) 17 where a noise coefficient is low, demodulating section 18 that demodulates the original signal from a transmitted signal, and analog-to-digital (A/D) converter 19 that converts an analog signal to a digital signal.

An operation of radio apparatus 10 configured as above will be described below. In the transmitting system, after passing PA 14, a signal modulated by modulating section 13 is separated by CUP 15 into a signal to feed back to the receiving system and a signal to transmit as is, in order to compensate for the distortion of the input signal.

The signal separated as distortion compensation from CUP 15 is output to LNA 17 through SW 16 of the receiving system, and then demodulated by demodulating section 18. The demodulated received signal includes a distortion component, so that pre-distortion section 11 compares this received signal and the original transmitting signal, extracts a produced distortion component, and adds the extracted distortion component to the input transmitting signal to compensate distortion. This makes possible communication of high precision where a distortion component is removed.

By this means, by using a configuration of a radio apparatus as in patent literature 1, it is possible to compensate for distortion by extracting a distortion component of the transmitting system by the feedback through the receiving system and adding the extracted distortion component to the original signal.

CITATION LIST

Patent Literature

PTL 1
Japanese Patent Application Laid-Open No. 2009-055378

SUMMARY OF INVENTION

Technical Problem

However, in a millimeter waveband, since loss is produced by using CUP 15 after PA 14 outputs, there is a problem that the output power level in an antenna terminal decreases. Since by providing SW 16 before LNA 17 in the receiving system, loss is also produced here, there is a problem that total noise figure (NF) in the receiving system is deteriorated.

Furthermore, to communicate in a short-range (where, for example, 1 cm-1 m is assumed) using a millimeter waveband, a dynamic range of receiving power is large as approximately 40 dB, so that a measure including to switch gains in each circuit may be necessary. However, in the method of present literature 1, it is necessary to send back a transmitting signal to the receiving system at a certain level, so that there is a problem that it is difficult to compensate distortion to suit each receiving power.

It is therefore an object of the present invention to provide a radio communication apparatus that has a normal transmitting/receiving mode and a distortion correction mode, and to provide a radio communication apparatus and radio communication method that communicates successfully without influencing circuit characteristics in a normal transmitting/receiving mode, or sends back a transmitting signal to the receiving system, extracts a distortion component due to narrowband characteristics or non-linear characteristics of a circuit, and compensates distortion in a distortion correction mode.

Solution to Problem

The radio communication apparatus of the present invention having a normal transmitting/receiving mode and a distortion correction mode, includes a transmitting circuit that includes a transmitting processing circuit that produces a high frequency signal from a transmitting baseband signal by radio transmitting process and a power amplifier that amplifies the high frequency signal; a transmitting antenna that transmits the high frequency signal amplified by the power amplifier; a receiving antenna that receives the high frequency signal transmitted by the transmitting antenna; a receiving circuit that includes a low noise amplifier to amplify the high frequency signal received by the receiving antenna and a receiving processing circuit to generate a receiving baseband signal by demodulating the high frequency signal amplified by the low noise amplifier; a distortion detecting section that detects a distortion component using the transmitting baseband signal and the receiving baseband signal; an adjustment section that adjusts the degree of coupling between the transmitting antenna and the receiving antenna; and a control section that switches the degree of coupling depending on the normal transmitting/receiving mode or the distortion correction mode.

According to this configuration, it is possible to communicate successfully without influencing circuit characteristics in a normal transmitting/receiving mode, and to send back a transmitting signal to the receiving system, extract a distortion component due to narrowband characteristics and non-linear characteristics of a circuit, and correct distortion in a distortion correction mode.

The radio communication apparatus of the present invention further includes a gain control section that controls a gain in at least one of the power amplifier or the low noise amplifier, where the control section controls the degree of coupling to allow the strength of the signal to be sent back from the transmitting antenna to the receiving antenna to have a level not to produce distortion in the receiving circuit, based on the gain provided by the gain control section.

According to this configuration, since it is possible to adjust the strength of a signal to be sent back from a transmitting antenna to a receiving antenna, even if the characteristic of a power amplifier or a low noise amplifier is changed, it is possible to adjust the desired receiving power to input to a receiving circuit.

In the radio communication apparatus of the present invention, a GND is arranged between the transmitting antenna and the receiving antenna; and the adjustment section includes: a passive element; and a switch that is arranged between the GND and the passive element.

According to this simple configuration to arrange a passive elements and switches between transmitting/receiving antennas, it is possible to send back a transmitting signal to the receiving system in a distortion correction mode, and to communicate successfully without influencing circuit characteristic in a normal transmitting/receiving mode.

In the radio communication apparatus of the present invention, a GND is arranged between the transmitting antenna and the receiving antenna; and the coupling degree adjustment section includes: a passive element; and a variable capacitance that is arranged between the GND and the passive element.

According to this simple configuration to arrange a passive elements and variable capacitance between transmitting/receiving antennas, it is possible to send back a transmitting signal to the receiving system in a distortion correction mode, and to communicate successfully without influencing circuit characteristic in a normal transmitting/receiving mode.

In the radio communication apparatus of the present invention, an electric field surface of the transmitting antenna and an electric field surface of the receiving antenna are arranged to face each other.

According to this configuration, since it is possible to electromagnetically couple transmitting/receiving antennas through a passive element by facing electric field surfaces of transmitting/receiving antennas each other, it is possible to send back a transmitting signal to the receiving system.

In the radio communication apparatus of the present invention, the transmitting circuit, the receiving circuit, and the switch are formed by MMIC.

This configuration can form a coupling degree adjustment circuit by mounting MMIC on an antenna substrate, so that it is possible to provide a radio communication apparatus at low cost.

In the radio communication apparatus of the present invention, the transmitting antenna is formed by a plurality of antenna elements; the adjustment section is formed by a plurality of phase shifters, where a plurality of phase shifters are provided between a plurality of antenna elements and the power amplifier; and the control section controls the degree of coupling by adjusting a phase of a plurality of phase shifters.

According to this configuration, since it is possible to switch the strength of a signal to be sent back from a transmitting antenna to a receiving antenna, can by making the directivity of a transmitting antenna variable using phase shifters, it is possible to send back a signal from a transmitting antenna to a receiving antenna in a distortion correction mode and to communicate successfully without influencing circuit characteristics in a normal transmitting/receiving mode.

The radio communication method of the present invention that is applied to a radio communication apparatus to have a normal transmitting/receiving mode and a distortion correction mode, the method includes: generating a high frequency signal from a transmitting baseband signal by radio transmitting process; generating a transmitting signal by amplifying the high frequency signal; sending the transmitting signal; outputting as a received signal after receiving the transmitting signal; amplifying the received signal; generating a receiving baseband signal by demodulating the amplified received signal; detecting a distortion component using the transmitting baseband signal and the receiving baseband signal; adjusting the degree of coupling between a transmitting antenna and a receiving antenna; and switching the degree of coupling depending on the normal transmitting/receiving mode or the distortion correction mode.

According to this method, it is possible to communicate successfully without influencing circuit characteristics in a normal transmitting/receiving mode, and to extract a distortion component due to narrowband characteristics and non-linear characteristics of a circuit, send back a transmitting signal to the receiving system, and correct distortion in a distortion correction mode.

Advantageous Effects of Invention

With a radio communication apparatus having a normal transmitting/receiving mode and a distortion correction mode, the present invention can realize good communication without influencing circuit characteristics in a normal transmitting/receiving mode, and can send back a transmitting signal to the receiving system, extract a distortion component due to narrowband characteristics or non-linear characteristics of a circuit, and compensate distortion in a distortion correction mode.

BRIEF DESCRIPTION OF DRAWINGS

FIG. 4 shows one example of a control method of a coupling degree of a radio communication according to embodiment 1;

DESCRIPTION OF EMBODIMENTS

Embodiments of the present invention will be described in detail with reference to the accompanying drawings.

(Embodiment 1)

Figure 1:
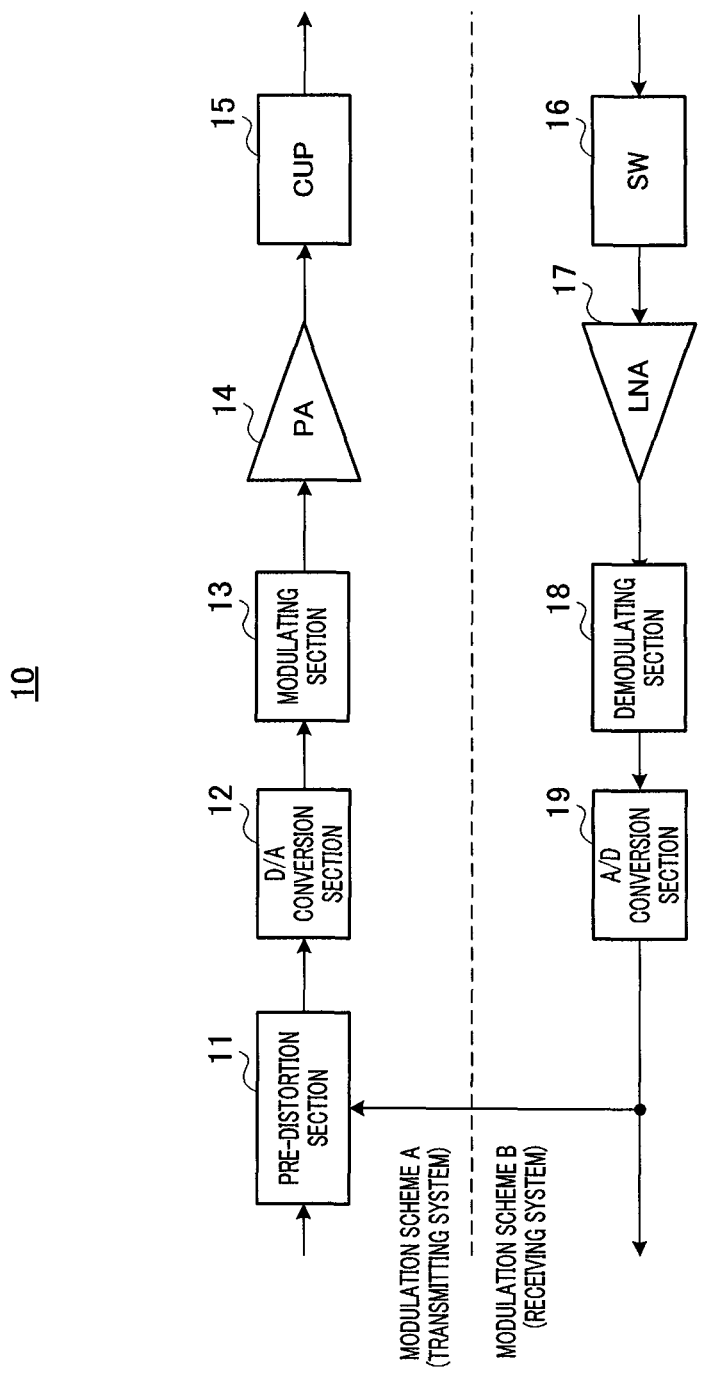
FIG. 1 is a schematic configuration diagram of a conventional radio communication apparatus.
Figure 2:
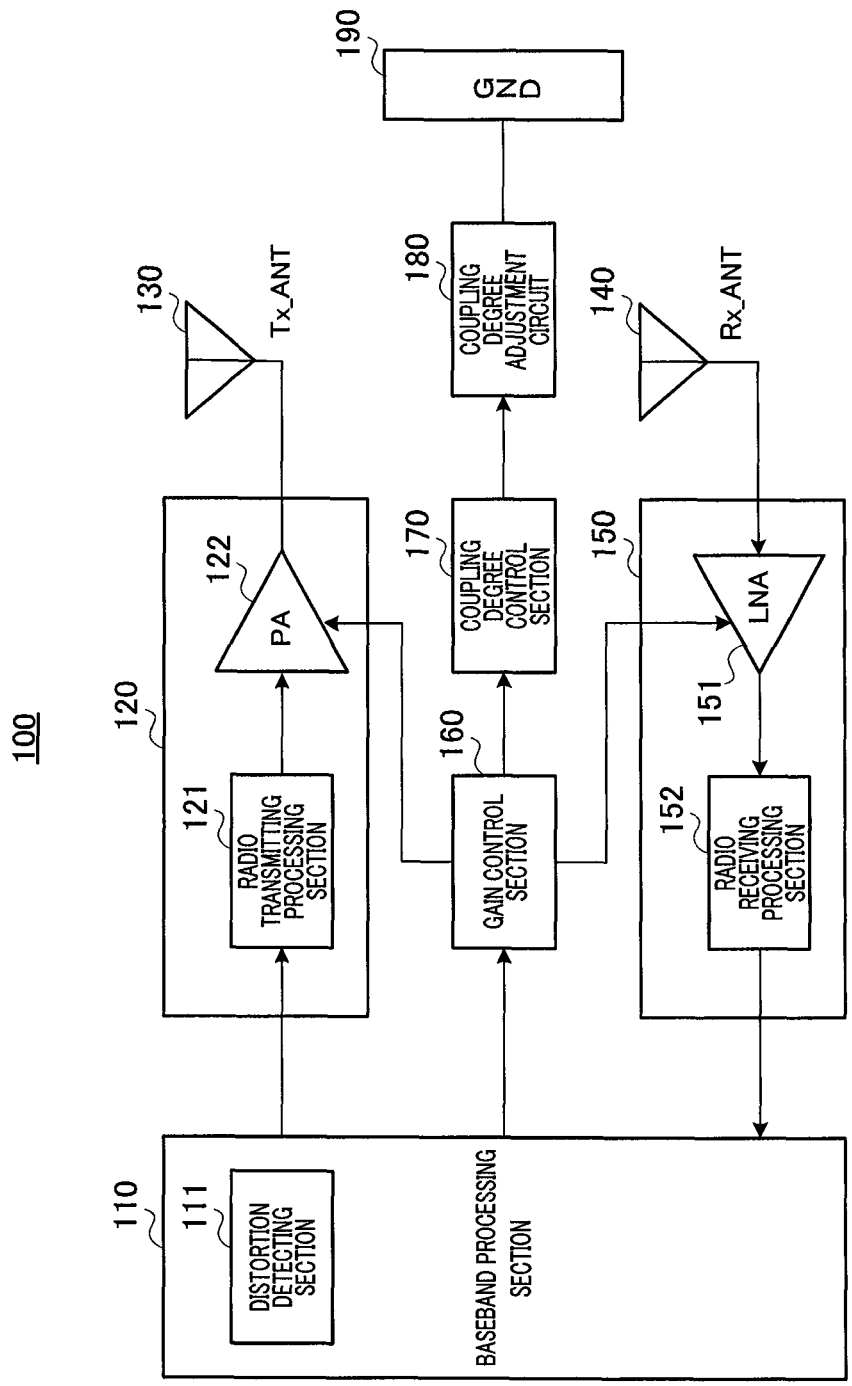
FIG. 2 is a block diagram showing a main configuration of a radio communication apparatus according to embodiment 1 of the present invention.

FIG. 2 is a block diagram showing a main configuration of a radio communication apparatus according to the present embodiment. Radio communication apparatus 100 according to the present embodiment has a normal transmitting/receiving mode and a distortion correction mode.

Baseband (BB) processing section 110 produces a transmitting baseband signal and outputs the produced transmitting baseband signal to transmitting circuit 120. Baseband processing section 110 calculates the receiving power of the receiving baseband signal of digital domain (described later), and outputs the calculated receiving power to gain control section 160.

Transmitting circuit 120 has radio transmitting processing section 121 and a power amplifier (PA) 122.

Radio transmitting processing section 121 converts a transmitting baseband signal into a high frequency signal by performing radio transmitting process including at least one of digital-to-analog (D/A) conversion, modulation, and up-conversion.

PA 122 amplifies a high frequency signal.

Transmitting antenna (Tx_ANT) 130 transmits a high frequency signal amplified by PA 122.

Receiving antenna (Rx_ANT) 140 receives a high frequency signal that is transmitted from transmitting antenna 130 and arrives through a radio channel.

Receiving circuit 150 has low noise amplifier (LNA) 151 and radio receiving processing section 152.

LNA 151 amplifies a high frequency signal received by receiving antenna 130.

Radio receiving processing section 152 converts a high frequency signal amplified by LNA 151 into a receiving baseband signal by performing radio receiving process including at least one of demodulation, down-conversion, and analog-to-digital (A/D) conversion.

Distortion detecting section 111 detects a distortion component of a receiving baseband signal. There is, for example, a distortion component detecting method of comparing a transmitting baseband signal and a receiving baseband signal and detecting the difference as a distortion component. The method of distortion component detection of a receiving baseband signal is not limited to this, and, for example, it is equally possible to detect distortion component of a receiving baseband signal as a distortion component including adjacent channel leakage power (ACLP). Although FIG. 2 illustrates a configuration example where distortion detecting section 111 is inside of baseband processing section 110, it is equally possible to provide distortion detecting section 111 on the outside of baseband processing section 110.

Furthermore, distortion detecting section 111 compensates distortion by adding the degree of correction based on the detected distortion component, to a transmitting baseband signal.

Gain control section 160 controls gain modes of PA 122 and LNA 151, based on receiving power of a receiving baseband signal. Specifically, gain control section 160 controls the gain modes of PA 122 and LNA 151 to one of a high gain mode or a low gain mode, so that linearity of LNA 151 or radio receiving processing section 152 is maintained. Gain control section 160 outputs information of gain modes of controlled PA 122 and LNA 151 to coupling degree control section 170.

Coupling degree control section 170 switches the degree of coupling of coupling degree adjustment circuit 180 depending on a normal transmitting/receiving mode or a distortion correction mode. For example, coupling degree control section 170 uses as input an operation mode signal (not shown) that indicates either a normal transmitting/receiving mode or a distortion correction mode, and switches the degree of coupling in coupling degree adjustment circuit 180, according to the input operation mode signal.

Furthermore, in a distortion correction mode, coupling degree control section 170 controls the degree of coupling of coupling degree adjustment circuit 180, based on gain modes of PA 122 and LNA 151. Specifically, coupling degree control section 170 determines on the degree of coupling of coupling degree adjustment circuit 180, based on the degree of gain modes of PA 122 and LNA 151. Coupling degree control section 170 produces a control signal showing the determined degree of coupling (the target degree of coupling), and outputs the produced control signal to coupling degree adjustment circuit 180. The method of determining the target degree of coupling will be described later.

Coupling degree adjustment circuit 180 adjusts the degree of coupling between transmitting antenna 130 and receiving antenna 140, based on a control signal output from coupling degree control section 170. The method of adjusting coupling degree in coupling degree adjustment circuit 180 will be described later.

GND 190 is a ground (GND) connected to coupling degree adjustment circuit 180, and GND 190 is arranged between transmitting antenna 130 and receiving antenna 140.

With radio communication apparatus 100 formed as above, the transmitting system is formed by transmitting circuit 120 (radio transmitting processing section 121 and PA 122) and transmitting antenna 130, and the receiving system is formed by receiving antenna 140 and receiving circuit 150 (LNA 151 and radio receiving processing section 152).

Next, an operation of radio communication apparatus 100 according to the present embodiment will be described.

With the transmitting system, a transmitting baseband signal produced by baseband processing section 110 is converted from a digital domain signal into an analog domain signal, and then converted into a high frequency signal. The converted high frequency signal is amplified by PA 122 and then radiated from transmitting antenna 130.

On the other hand, with the receiving system, a high frequency signal received by receiving antenna 140 is amplified by LNA 151, and the amplified high frequency signal is down-converted in radio receiving processing section 152 and is converted from a receiving baseband signal of an analog domain into a receiving baseband signal of a digital domain. The converted receiving baseband signal is subject to signal process in baseband processing section 110.

Here, generally, a circuit has frequency characteristics and non-linear characteristics. Thus, when a signal passes, signal distortion is produced. A receiving baseband signal includes a distortion component produced by each circuit of the transmitting system and the receiving system, and, if this remains as is, the performance of radio communication apparatus 100 will be deteriorated.

In order to correct this performance deterioration, distortion detecting section 111 that detects a distortion component by comparing a receiving baseband signal and the original transmitting baseband signal is provided in radio communication apparatus 100 and distortion detecting section 111 compensates distortion by adding the extracted distortion component to a transmitting baseband signal.

In this manner, radio communication apparatus 100 detects a distortion component by sending back a high frequency signal from the transmitting system to the receiving system and by comparing a receiving baseband signal and a transmitting baseband signal of the sent back high frequency signal.

Moreover, with short-range communication using a millimeter waveband, when communication distance changes from 1 cm to 1 m, with 40 dB of dynamic range of receiving power, the linearity of a demodulating section included in LNA 151 or radio receiving processing section 152 is not enough, and it is expected that a signal will be distorted. When the size of receiving power is identified to be enough, gain control section 160 controls the gains of PA 122 or LNA 151 downward. By this means, LNA 151 or radio receiving processing section 152 are controlled to maintain their linearity.

Next, the method of sending back a signal from the transmitting system to the receiving system to extract a distortion component that a circuit of radio communication apparatus 100 has. This method is effective in a time division duplex (TDD) method.

With a normal transmitting/receiving mode, for example, by turning off the power of the receiving system during transmitting and by turning off the power of the transmitting system during receiving, it is possible to eliminate the influence including inter transmitting/receiving interference. On the other hand, with a distortion correction mode, transmitting/receiving systems are turned on at the same time during a period in which no data is transmitted/received (for example, a preamble period of transmitting data). By this means, it is possible to receive and demodulate a radiated signal from transmitting antenna 130 by receiving antenna 140 and detect a distortion component using the acquired receiving base band in distortion detecting section 111, without providing an additional circuit to send back a signal in the transmitting system and the receiving system that are necessary in a normal transmitting/receiving mode.

In the present embodiment, coupling degree control section 170 adjusts the degree of coupling between transmitting antenna 130 and receiving antenna 140 to have a level that the received high frequency modulated signal is not distorted in LNA 151 or radio receiving processing section 152.

Here, for example, short-range communication using a millimeter waveband suffers substantial loss in space, if radio communication apparatus 100 tries to cover communication distance from 1 cm to 1 m, the receiving system requires a dynamic range of 40 dB. Thus, when communication distance between PA 122 and LNA 151 comes closer in a high gain state, receiving power increases, which produces a signal distortion in LNA 151 or radio receiving processing section 152. For this reason, when communication distance is close enough, control to operate LNA 151 in a low gain mode and decrease the gain of LNA 151, or control to decrease the transmitting power of PA 122 may be necessary.

When operating PA 122 or LNA 151 in a low gain mode on decreasing transmitting power of PA 122, the circuit characteristic itself changes and a distortion component produced by the circuit also changes. Therefore, in order to compensate distortion of a circuit, it is necessary to evaluate PA 122 and LNA 151 both in a high gain mode and in a low gain mode respectively.

On the other hand, when a signal radiated from transmitting antenna 130 is received by receiving antenna 140, receiving power is determined by cross-coupling between transmitting antenna 130 and receiving antenna 140. Here, the degree of cross-coupling is generally fixed if the shape of an antenna is settled. Even if the signal strength sent back from transmitting antenna 130 to receiving antenna 140 has a level not to produce distortion in LNA 151 in a low gain mode, the input power input to LNA 151 in a high gain mode is large. For this reason, for example, if LNA 151 tries to extract a distortion component in both a high gain mode and a low gain mode, there is a problem that a signal is distorted in LNA 151 or a later in radio receiving processing section 152.

Thus, as shown in FIG. 2, the present embodiment provides coupling degree adjustment circuit 180 between transmitting antenna 130 and receiving antenna 140 and adjusts the degree of cross-coupling between transmitting/receiving antennas by means of this coupling degree adjustment circuit 180. By this means, radio communication apparatus 100 can demodulate the received high frequency signal without distortion and extract the original distortion component, when LNA 151 assumes either high gain mode or low gain mode. This point will be explained in detail.

Figure 3:
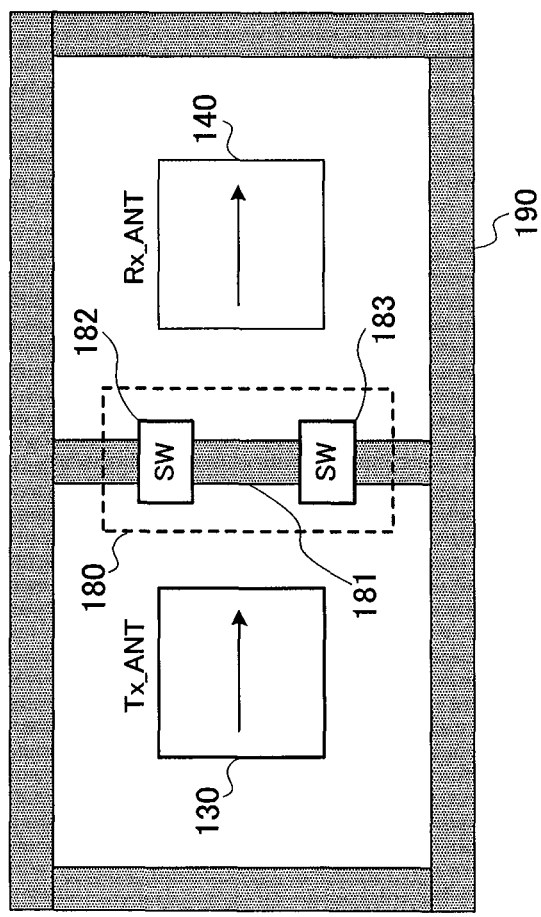
FIG. 3 is a schematic configuration diagram about an adjustment of the degree of cross-coupling among transmitting/receiving antennas in a radio communication apparatus of embodiment 1.

FIG. 3 is a schematic configuration diagram related to adjustment of the degree of coupling between transmitting/receiving antennas.

Coupling degree adjustment circuit 180 has passive element 181 and switches 182 and 183 arranged between GND 190 and passive element 181. In FIG. 3, the arrows in transmitting antenna 130 and receiving antenna 140 indicate electric field surfaces, and electric field surfaces (E surface) of transmitting antenna 130 and receiving antenna 140 are arranged to face each other as shown in FIG. 3. Thus, as described later, since transmitting/receiving antennas can electromagnetically couple through passive element 181, it is possible to send back a high frequency signal from the transmitting system to the receiving system.

GND 190 is arranged to surround transmitting antenna 130 and receiving antenna 140. Arranging at least part of GND 190 between transmitting antenna 130 and receiving antenna 140 is enough.

Passive element 181 is arranged midway between transmitting antenna 130 and receiving antenna 140 as to separate GND 190.

Switches 182 and 183 are arranged between both ends of passive element 181 and GND 190.

An operation of coupling degree adjustment circuit 180 in both a normal transmitting/receiving mode and a distortion correction mode will be explained below. In the following, transmitting antenna 130 and receiving antenna 140 each formed with one patch antenna element, will be described.

For example, in a normal transmitting/receiving mode, coupling degree control section 170 places switches 182 and 183 in an ON state—that is short-circuits passive element 181 and GND 190 electrically. Since passive element 181 becomes part of GNDs 190, GNDs 190 are arranged to surround both transmitting antenna 130 and receiving antenna 140. Even if operation modes of PA 122 and LNA 151 are in any of high or low, coupling degree control section 170 places switches 182 and 183 in an ON state.

On the other hand, in a distortion correction mode, when PA 122 and LNA 151 set up transmitting/receiving power sources in a high mode, in an ON state of switches 182 and 183, the degree of coupling between transmitting antenna 130 and receiving antenna 140 is adjusted not to produce distortion in LNA 151.

Furthermore, when at least one of PA 122 and LNA 151 is in a low mode, the communication distance is close. Thus, to suit a low mode, the strength of a signal to be sent back from the transmitting system to the receiving system needs to be increased. Therefore, coupling degree control section 170 places switches 182 and 183 in an OFF state to strengthen the degree of coupling of transmitting antenna 130 and receiving antenna 140. When coupling degree control section 170 allows switches 182 and 183 OFF state—that is, electrically opens passive element 181 and GND 190—passive element 181 couples electromagnetically with transmitting antenna 130 and receiving antenna 140 respectively. Thus, passive element 181 plays a role of a waveguide device, and works to strengthen cross-coupling of transmitting antenna 130 and receiving antenna 140. By this means, it is possible to increase the strength of a signal to be sent back from the transmitting system to the receiving system.

FIG. 4 is a diagram showing operation condition of a switch in each of a normal transmitting/receiving mode and a distortion correction mode.

As explained above, transmitting antenna 130 and receiving antenna 140 are arranged with E surfaces facing each other. This is because the connection between transmitting/receiving antennas and passive element 181 will be strengthened by allowing E surfaces to face each other when passive element 181 operates as a waveguide device. However, if the coupling degree is not required as E surfaces, an arrangement where H surfaces (magnetic field surfaces) face each other is equally possible.

As described above, according to the present embodiment, distortion detecting section 111 detects a distortion component by using a transmitting baseband signal and a receiving baseband signal, coupling degree adjustment circuit 180 adjusts the degree of coupling between transmitting antenna 130 and receiving antenna 140, and coupling degree control section 170 switches the degree of coupling depending on a normal transmitting/receiving mode or a distortion correction mode. By this means, in a normal transmitting/receiving mode, radio communication apparatus 100 can communicate successfully without influencing a circuit characteristic that includes loss. Radio communication apparatus 100 sends back a transmitting signal to the receiving system in a distortion correction mode, extracts a distortion component due to narrowband characteristics or non-linear characteristics of a circuit, and makes distortion correction possible. In the present embodiment, there is no need to provide an additional circuit for a signal to send back in the transmitting system and the receiving system that are necessary in a normal transmitting/receiving mode, so that it is possible to prevent passing loss produced by an additional circuit.

Coupling degree control section 170 controls the degree of coupling of coupling degree adjustment circuit 180 to allow the strength of a signal to be sent back from the transmitting system to the receiving system to have a level not to produce distortion in receiving circuit 150, based on a gain in at least one of gain mode information among gain modes of PA 122 and LNA 151 provided by gain control section 160. By this means, since it is possible to adjust the strength of a signal to be sent back from transmitting antenna 130 to receiving antenna 140, even if the characteristic of PA 122 or LNA 151 is changed, it is possible to adjust the strength of a signal to send back to allow desired receiving power to be input to receiving circuit 150. As a result, it is possible to provide a radio communication apparatus having good received quality characteristics by extracting and correcting a distortion component in an actual operation state of each circuit.

Although a patch antenna has been used above description as an example of an antenna element, this is by no means limiting, and any form is possible as long as a single element as an antenna.

Figure 5:
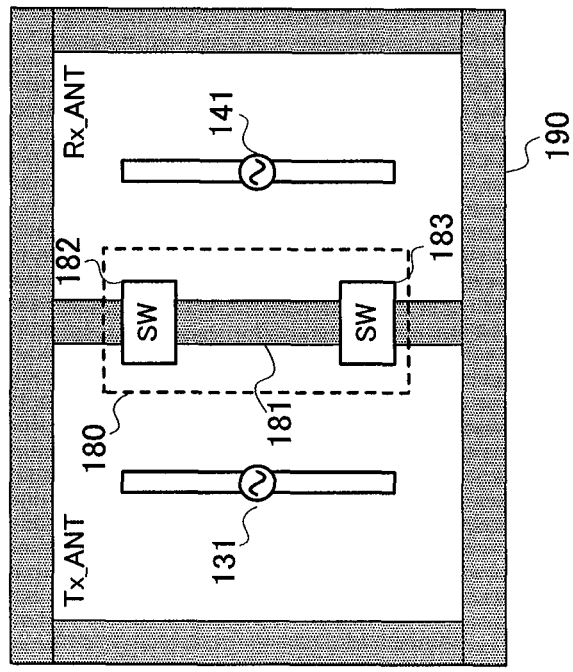
FIG. 5 is a schematic configuration diagram about an adjustment of the degree of cross-coupling among transmitting/receiving antennas in a radio communication apparatus of embodiment 1.

FIG. 5 shows a schematic configuration diagram related to an adjustment of a cross-coupling degree between transmitting/receiving antennas using dipole antennas as another example of an antenna element. FIG. 5 differs from FIG. 3 in that transmitting antenna 131 and receiving antenna 141 are formed using dipole antennas respectively. Other components are the same as transmitting antenna 130 and receiving antenna 140 shown in FIG. 3 formed by using patch antenna 1 element, descriptions will be omitted.

Generally, in a configuration that arranges a passive element including a waveguide device and a reflector, it is preferable to keep a distance of a waveguide and a reflector to a radiator, such as a Yagi antenna, about ¼ wavelength. However, in the present embodiment, it is not the main point to provide directivity, but the main point is to increase a coupling degree of transmitting antenna 131 and receiving antenna 141, or make the coupling degree variable. Thus, the interval between transmitting antenna 131 and receiving antenna 141 which are radiators and coupling degree adjustment element 180 which plays a role of a waveguide device, is not particularly limited, and the interval can be determined based on the necessary degree of coupling.

Obviously, the same effect can be achieved by using, for example, a monopole antenna or a slot antenna, other than a dipole antenna.

Figure 6:
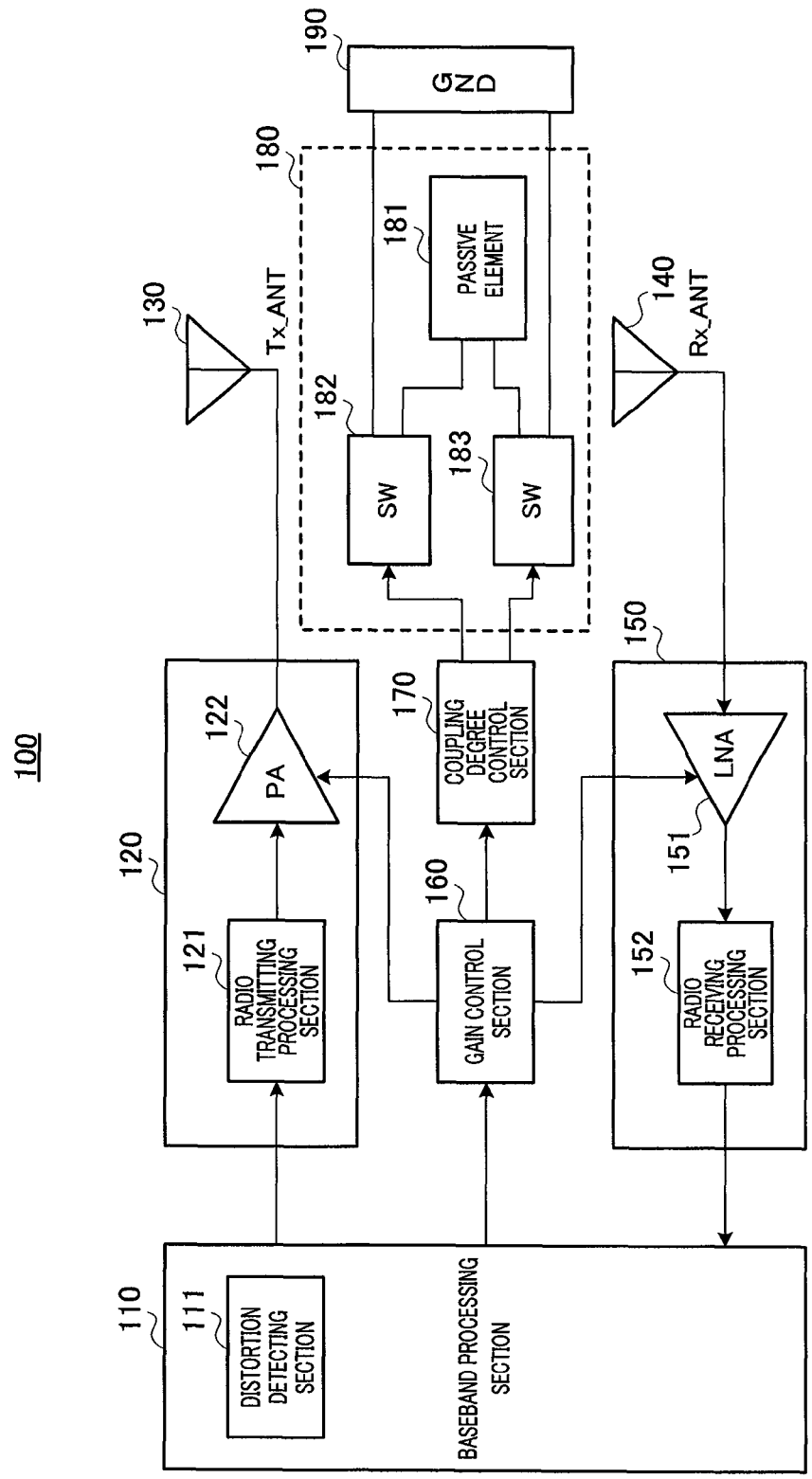
FIG. 6 is a block diagram showing a main configuration of a radio communication apparatus according to embodiment 1.

Although a configuration using switches 182 and 183 as components of coupling degree adjustment circuit 180 has been explained, configurations of switches 182 and 183 are not especially limited, and it is equally possible to form switches 182 and 183 using discrete elements. For example, as shown in FIG. 6, it is equally possible to form switches 182 and 183 on MMIC as other circuits. By this means, for example, it is possible to form coupling degree adjustment circuit 180 by mounting MMIC on an antenna substrate, so that there is no need to separately mount switches 182 and 183 on an antenna substrate and it is possible to reduce the number of components and provide a radio communication apparatus at low cost.

Although a configuration where coupling degree adjustment circuit 180 makes the degree of coupling variable using switches 182 and 183 has been explained above, it is equally possible to make the degree of coupling variable using, for example, variable capacitance, instead of switches 182 and 183. In a configuration using variable capacitance, it is possible to change a capacitance value continuously and to change the degree of coupling continuously.

Figure 7:
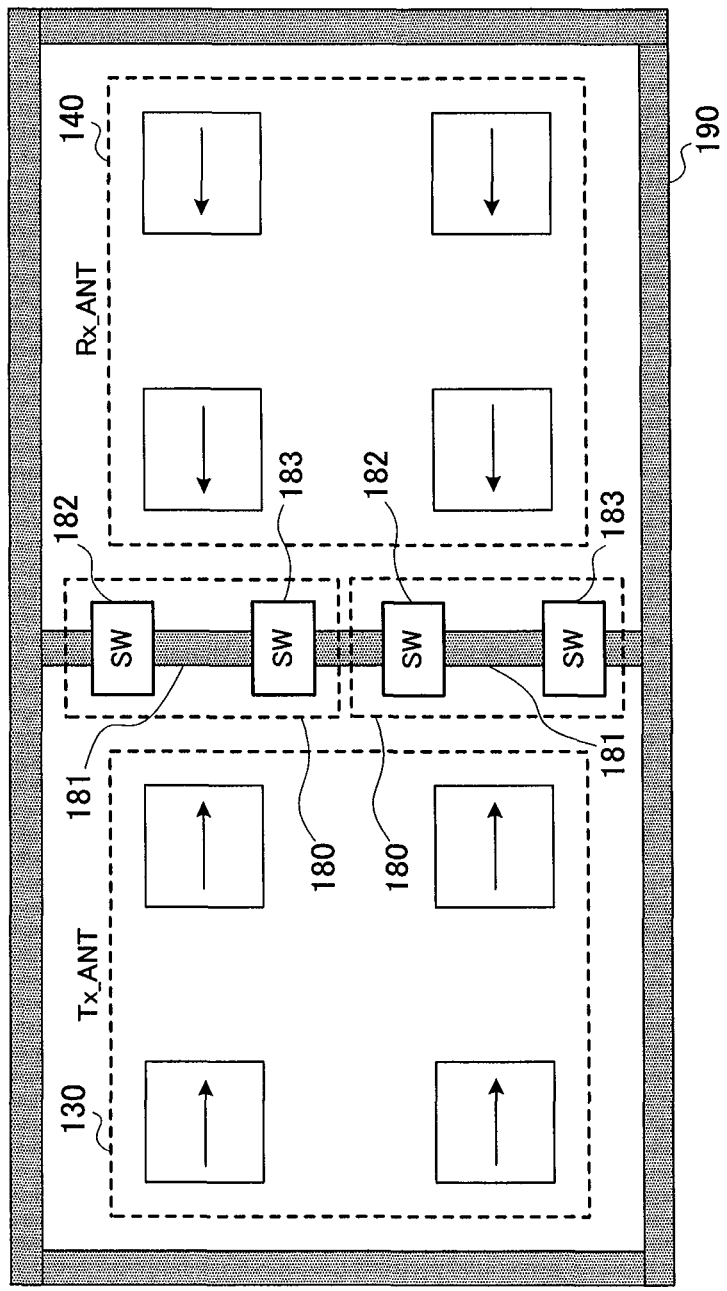
FIG. 7 is another schematic configuration diagram related to an adjustment of the degree of cross-coupling among transmitting/receiving antennas in a radio communication apparatus of embodiment 1.

Although a configuration has been described above where transmitting antenna 130 and receiving antenna 140 are each one element, obviously, it is equally possible to array each transmitting/receiving antenna. As an example, FIG. 7 shows other schematic configuration diagram related to adjust the cross-coupling degree between transmitting/receiving antennas. FIG. 7 is an example where transmitting and receiving antennas are each formed using a four-element array. When transmitting/receiving antennas are formed using four-element arrays as shown in FIG. 7, the same effect can be achieved as above by providing coupling degree adjustment circuit 180 between two elements of transmitting antenna 130 and receiving antenna 140 which faces each other and adjusts the degree of coupling between transmitting/receiving antennas. Furthermore, even in a configuration providing coupling degree adjustment circuit 180 between one of two elements of transmitting antenna 130 and receiving antenna 140 faces each other, it is possible to adjust the degree of coupling between transmitting/receiving antennas.

(Embodiment 2)

Embodiment 1 uses a switch or variable capacitance as a coupling degree adjustment circuit, and adjusts the degree of cross-coupling between transmitting/receiving antennas. In the present embodiment, a configuration to adjust the cross-coupling degree between transmitting/receiving antennas will be described using a phase shifter as a coupling degree adjustment circuit.

Figure 8:
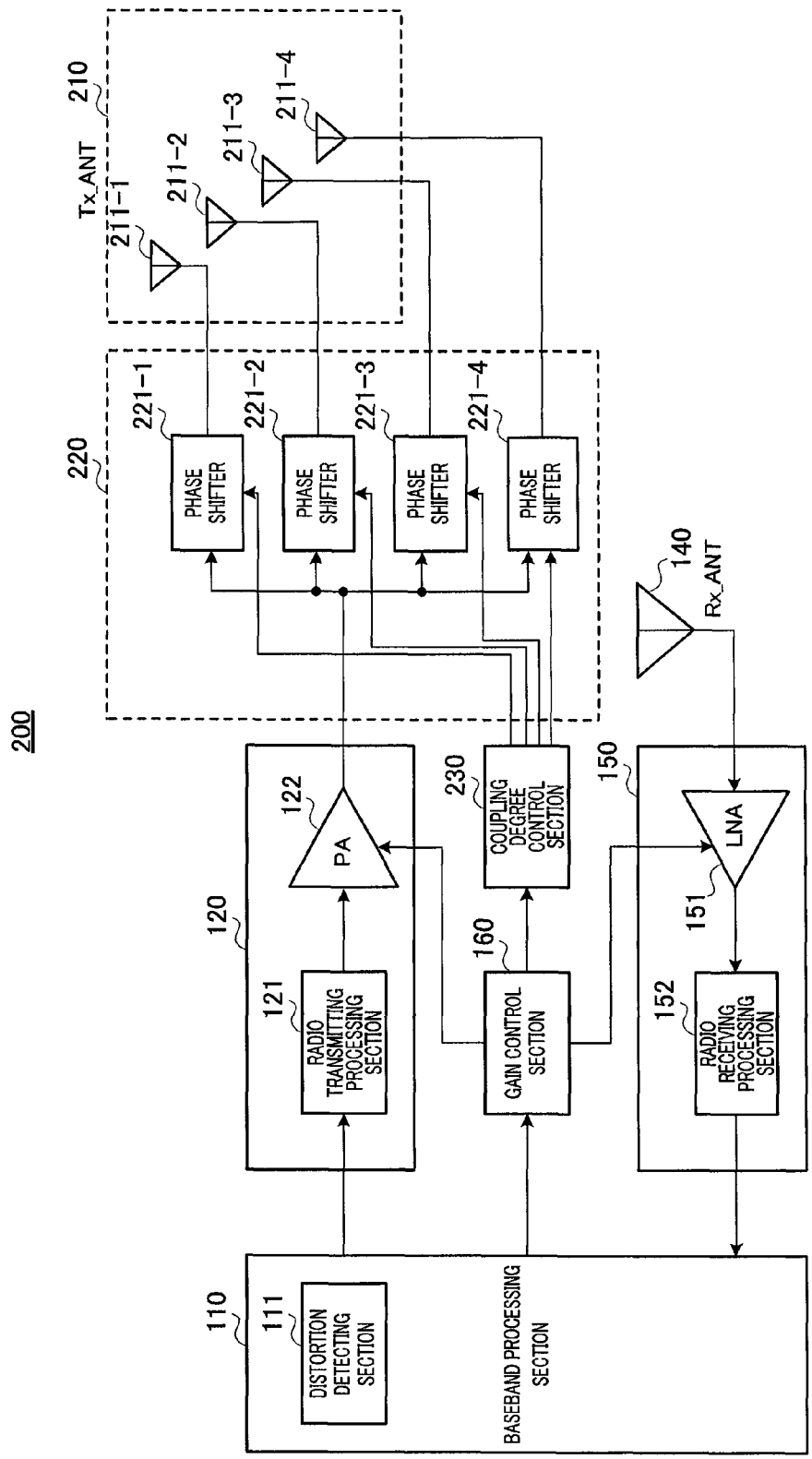
FIG. 8 is a block diagram showing a main configuration of a radio communication apparatus according to embodiment 2 of the present invention.

FIG. 8 is a block diagram showing a main configuration of radio communication apparatus according to the present embodiment. In radio communication apparatus 200 of FIG. 8, the same components in radio communication apparatus 100 will be assigned the same reference numerals in FIG. 2 and their explanations will be omitted. Radio communication apparatus 200 of FIG. 8 has transmitting antenna 210, coupling degree control section 230, and coupling degree adjustment circuit 220, instead of transmitting antenna 130, coupling degree control section 170, and coupling degree adjustment circuit 180 of radio communication apparatus 100 of FIG. 2.

Transmitting antenna 210 has a configuration including N (N is an integer which equals or exceeds 2) antenna elements 211-1~211-N. In the following, assume that N=4, a configuration where transmitting antenna 210 includes four antenna elements 211-1~211-4 will be explained.

Coupling degree adjustment circuit 220 has a configuration including N (N is an integer which equals or exceeds 2) phase shifter 221-1~221-N. Each phase shifter 221-k (k=1, 2, ..., N) is provided between a plurality of antenna elements 211-k and PA 122.

Coupling degree control section 230 switches the phase amount of phase shifter 221-k (k=1, 2, ..., N) of coupling degree adjustment circuit 220 depending on a normal transmitting/receiving mode or a distortion correction mode. For example, coupling degree control section 230 uses as an input an operation mode signal (not shown) that indicates either a normal transmitting/receiving mode or a distortion correction mode, and adjusts the phase in phase shifter 221-k (k=1, 2, ..., N) of coupling degree adjustment circuit 220 according to the input operation mode signal. In this way, by adjusting a phase of phase shifter 221-k (k=1, 2, ..., N) of coupling degree adjustment circuit 220, it is possible to control directivity, and, as a result, adjust the degree of coupling between transmitting/receiving antennas.

Furthermore, in a distortion correction mode, coupling degree control section 230 controls the phase of phase shifter 221-k (k=1, 2, ..., N) of coupling degree adjustment circuit 220, based on a gain mode of PA 122 and LNA 151. Specifically, coupling degree control section 230 determines the phase of phase shifter 221 (k=1, 2, ..., N) of coupling degree adjustment circuit 220 based on a gain mode of PA 122 and LNA 151. Coupling degree control section 230 produces a control signal indicating the determined phase (the target phase), and outputs the produced control signal to coupling degree adjustment circuit 220. The method of determining the target phase will be described later.

In this way, by adjusting a phase of phase shifter 221-k (k=1, 2, ..., N), coupling degree control section 230 controls the directivity and adjusts the degree of coupling between transmitting/receiving antennas. Thus, since the strength of wave radiation from transmitting antenna 130 to receiving antenna 140 changes depending on directivity, coupling degree control section 230 controls phases of phase shifter 221-k (k=1, 2, ..., N) to allow the strength of a signal to be sent back from transmitting antenna 130 to receiving antenna 140 to have a level not to produce distortion in receiving circuit 150. By this means, since radio communication apparatus 200 can adjust the strength of a signal to be sent back from transmitting antenna 130 to receiving antenna 140, even if the characteristic of PA 122 or LNA 151 is changed, it is possible to adjust the desired receiving power to be input to receiving circuit 150.

For example, when feeding power to four antenna elements 211-1~211-4 by the same phase, the directivity becomes symmetric to an arranging direction of four elements. Meanwhile, since by providing phase differences between four phase shifters 221-1~221-4, the direction of maximum radiation of transmitting antenna 130 formed by four elements tilts to the element arrangement direction, it is possible to change the strength of a radiated wave to the direction of receiving antenna 140 that is seen from transmitting antenna 130. As the number of antenna elements N increases, it is possible to control the directivity more, so that it is possible to adjust more the strength of wave radiation toward a direction from transmitting antenna 130 to receiving antenna 140. The shorter the interval between antenna elements, the larger the degree of cross-coupling between antenna elements, so that the influence upon directivity increases.

According to the present embodiment as above, transmitting antenna 130 is formed using N (N=4) antenna elements 211-1~221-N, coupling degree adjustment circuit 220 is formed using N phase shifters 221-1~221-N, each phase shifter 221-k (k=1, 2, ..., N) is provided between N antenna elements 211-k and PA 122, and coupling degree control section 230 adjusts phases of N phase shifters 221-1~221-N, controls directivity, and adjusts the degree of coupling between transmitting antenna 130 and receiving antenna 140. By this means, with radio communication apparatus 200 having a normal transmitting/receiving mode and a distortion correction mode, it is possible to communicate successfully without influencing circuit characteristics which includes a distortion in a normal transmitting/receiving mode. By sending back a transmitting signal to the receiving system in a distortion correction mode, it is possible to extract a distortion component due to a narrowband characteristic or a non-linear characteristic of a circuit, and to correct a distortion.

Coupling degree control section 230 adjusts phases of phase shifters 221-1~221-N and controls directivity of transmitting antenna 130, and, by this means, it is possible to provide the degree of cross-coupling between transmitting antenna 130 and receiving antenna 140 to be the desired value. By this means, radio communication apparatus 200 can adjust the desired receiving power to be input to the receiving system, even when characteristic of PA 122 or LNA 151 is changed. Thus, since it is possible to extract and correct a distortion component at an actual operation state of each circuit, it is possible to provide a radio communication apparatus of high received quality.

Although an example has been explained above where transmitting antenna 130 uses a four-element array configuration, the number of elements is not limited as long as at least two elements are provided. In the same way, to form receiving antenna 140 as N (N is an integer which equals or exceeds 2) element arrays, the directivity can be controlled in both transmitting/receiving, it is possible to increase the adjusting width of the cross-coupling degree.

(Embodiment 3)

Embodiment 1 and embodiment 2 send back a transmitting signal from the transmitting system to the receiving system, by adjusting the degree of cross-coupling between transmitting/receiving antennas. The present embodiment sends back a transmitting signal from the transmitting system to the receiving system, by adjusting the impedance between the transmitting system and the receiving system.

Figure 9:
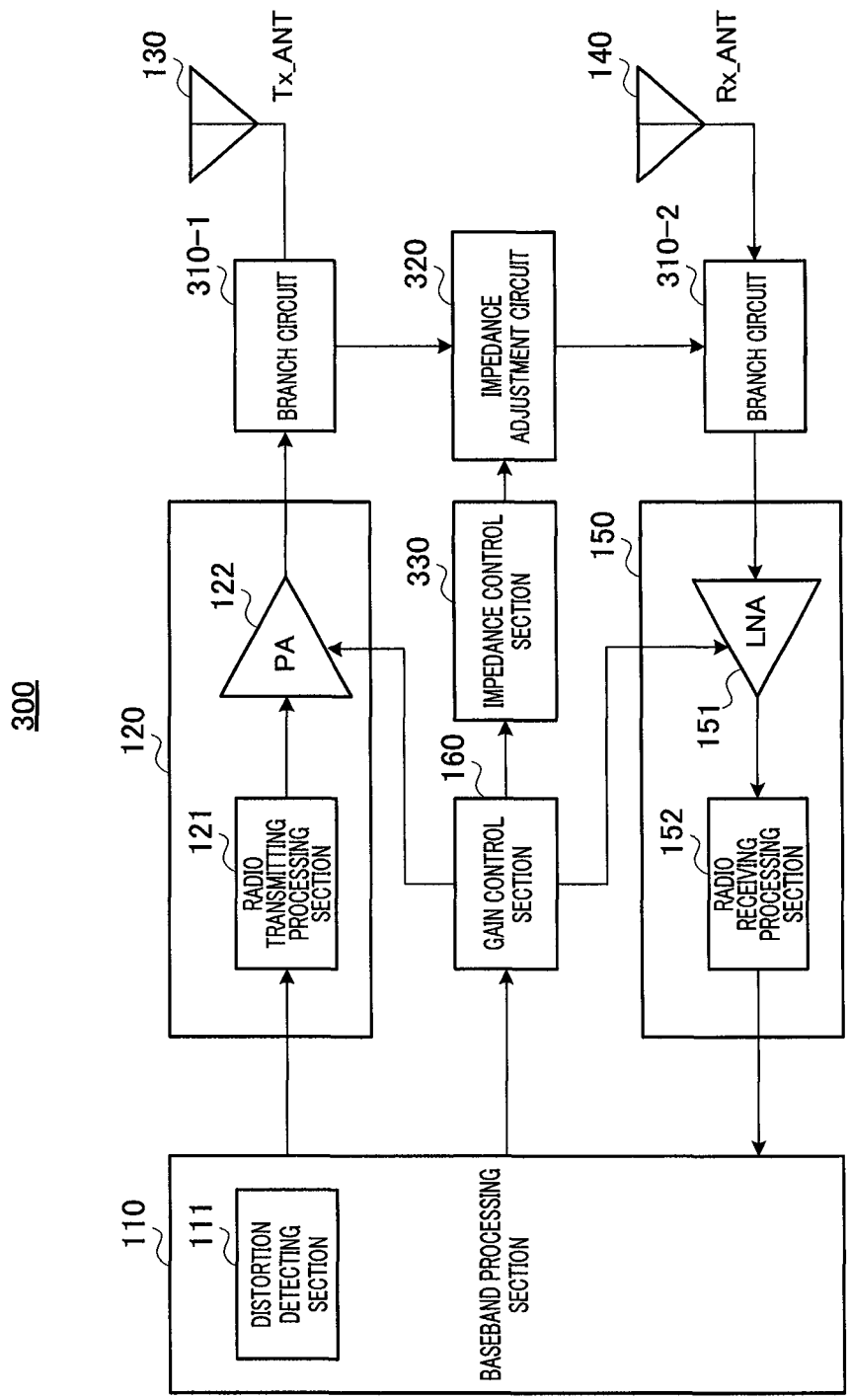
FIG. 9 is a block diagram showing a main configuration of a radio communication apparatus according to embodiment 3 of the present invention.

FIG. 9 is a block diagram showing a main configuration of a radio communication apparatus according to an embodiment of the present invention. In radio communication apparatus 300 of FIG. 9, the same components in radio communication apparatus 100 of FIG. 2 will be assigned the same reference numerals in FIG. 2 and their explanations will be omitted. Compared with radio communication apparatus 100 of FIG. 2, radio communication apparatus 300 of FIG. 9 employs a configuration that removes coupling degree control section 170 and coupling degree adjustment circuit 180 and adds branch circuits 310-1 and 310-2, impedance control section 330, and impedance adjustment circuit 320.

Branch circuit 310-1 has an input terminal, the first output terminal, a second output terminal, and is inserted between PA 122 and transmitting antenna 130. A high frequency signal amplified by PA 122 is input to an input terminal, the first output terminal is connected to transmitting antenna 130, and a second output terminal is connected to impedance adjustment circuit 320.

Branch circuit 310-2 has the first input terminal, a second input terminal, and an output terminal, and is inserted between receiving antenna 140 and LNA 151. A high frequency signal received by receiving antenna 140 is input to the first input terminal, a second output terminal is connected to impedance adjustment circuit 320, and an output terminal is connected to LNA 151.

Impedance adjustment circuit 320 is inserted between branch circuit 310-1 and branch circuit 310-2, and adjusts an impedance according to a control signal output from impedance control section 330 (described later).

Impedance control section 330 controls the impedance of impedance adjustment circuit 320 depending on a normal transmitting/receiving mode and a distortion correction mode. For example, impedance control section 330 receives as input an operation mode signal (not shown) that indicates either a normal transmitting/receiving mode or a distortion correction mode, and switches an impedance of impedance adjustment circuit 320 according to the input operation mode signal.

Specifically, in a normal transmitting/receiving mode, impedance control section 330 adjusts the impedance of impedance adjustment circuit 320, so that, seen from branch circuit 310-1 of the transmitting system and branch circuit 310-2 of the receiving system, the output terminal of branch circuit 310-1 and the second input terminal of branch circuit 310-2 connected to impedance adjustment circuit 320 are equivalent to an open state. By this means, it is possible to prevent producing a passing loss in branch circuits 310-1 and 310-2 and to realize good communicate.

On the other hand, in a distortion correction mode, impedance control section 330 adjusts the impedance of impedance adjustment circuit 320, so that a signal output from PA 122 is input to LNA 151 through branch circuit 310-1, impedance adjustment circuit 320, and branch circuit 310-2. By this means, it is possible to send back a high frequency signal from the transmitting system to the receiving system. This point will be described in detail.

Figures 10A, 10B:
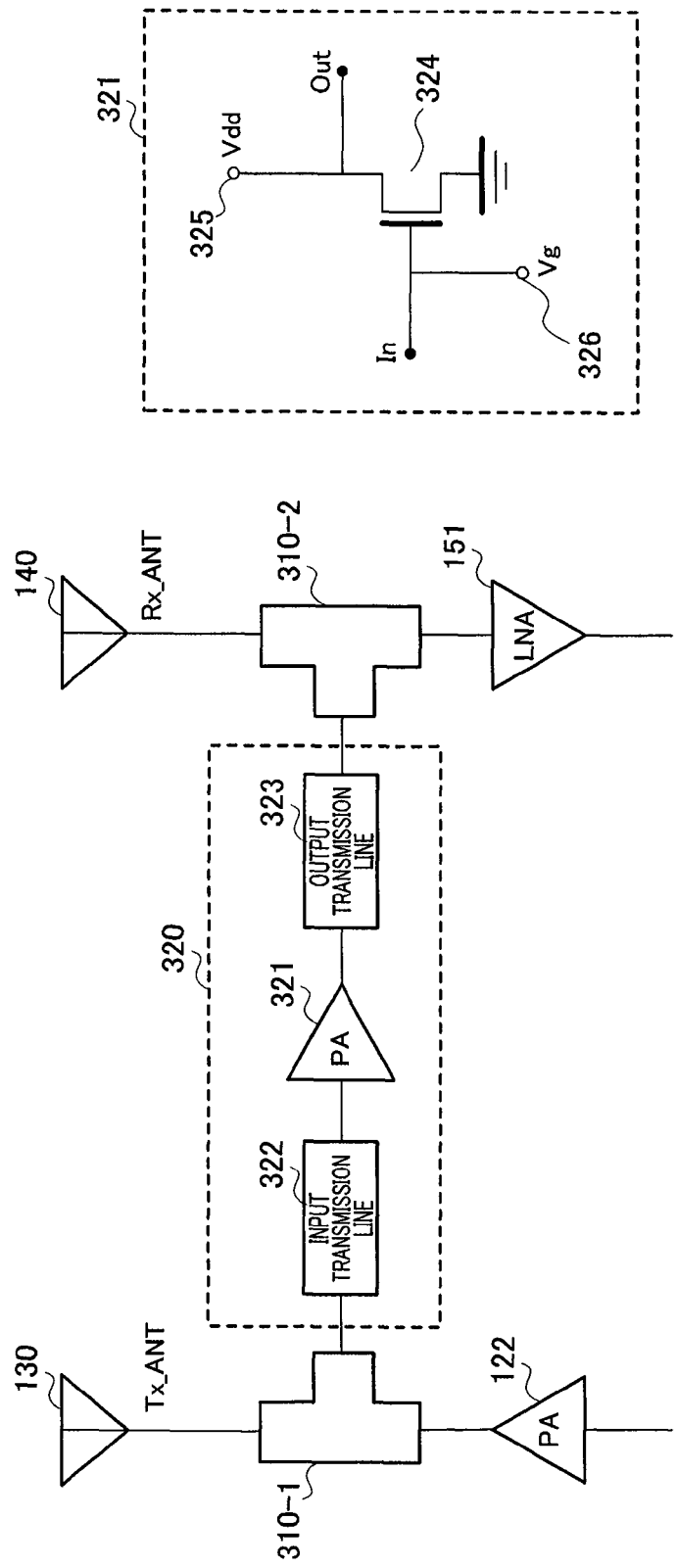
FIG. 10 shows one example of an inner configuration of an impedance adjustment circuit according to embodiment 3.

FIG. 10A shows an example of an internal configuration of impedance adjustment circuit 320. Impedance adjustment circuit 320 has amplifier (PA) 321, input transmission line 322, and output transmission line 323. The present embodiment will explain a configuration that, for example, PA 321 uses a transistor. FIG. 10B is a configuration example of transistor 324 forming PA 321. In FIG. 10B, transistor 324 has drain terminal 325 and gate terminal 326.

Impedance control section 330 applies a certain bias to drain terminal 325 and gate terminal 326 of transistor 324 and operates transistor 324 in a saturation domain, and by this means transistor 324 is operated to amplify (in an ON state). In contrast, if impedance control section 330 does not apply bias to one of drain terminal 325 and gate terminal 326 or both, transistor 324 does not operate as an amplifier (in an OFF state).

In transistor 324, input and output impedance varies between in an ON state and in an OFF state. In this case, by connecting input transmission line 322 to branch circuit 310-1 and adjusting the length of above mentioned input transmission line 322, it is possible to adjust the characteristic impedance of input impedance of when transistor 324 is in an OFF state, without applying one of gate bias and drain bias or both. By this means, it is possible to make the impedance look infinite when impedance adjustment circuit 320 is seen from the connecting point of branch circuit 310-1 and input transmission line 322.

In the same way, by connecting output transmission line 323 to branch circuit 310-2 and adjusting the length of above mentioned output transmission line 323, it is possible to adjust characteristic impedance of output impedance when transistor 324 is in an OFF state. By this means, it is possible to make the impedance look infinite when impedance adjustment circuit 320 is seen from the connecting point of branch circuit 310-2 and output transmission line 323.

In the present embodiment, with a normal transmitting/receiving mode, impedance control section 330 places transistor 324 in an OFF state. By this means, a signal does not transmit to impedance adjustment circuit 320 from both of branch circuits 310-1 and 310-2. High frequency signals output from PA 122 is all input to transmitting antenna 130 in the transmitting system, and high frequency signals received by receiving antenna 140 is all input to LNA 151 in the receiving system. As a result, in a normal transmitting/receiving mode, passing loss is not produced, so that it is possible to communicate successfully.

On the other hand, with a distortion correction mode, impedance control section 330 places transistor 324 in an ON state. By this means, since input and output impedance of transistor 324 changes from an OFF state, when seeing impedance adjustment circuit 320 from each branch circuits 310-1 and 310-2 the impedance is not infinite, so that, in the transmitting system, part of a high frequency signal output from PA 122 transmits to impedance adjustment circuit 320.

Furthermore, part of a high frequency signal output from PA 122 is input to LNA 151 through impedance adjustment circuit 320 and branch circuit 310-2, and by this means distortion detecting section 111 can correct distortion.

Impedance control section 330 may adjust bias condition of one of drain terminal 325 and gate terminal 326 or both of transistor 324. By adjusting bias condition, it is possible to change a gain of PA 321. By this means, impedance control section 330 adjusts a bias condition by switching transistor 324 on and off, so that it is possible to change the strength of a signal to be sent back from the transmitting system to the receiving system and to correct distortion in each state where PA 122 or LNA 151 is operated by using a high gain mode or a low gain mode.

According to the present embodiment as above, by providing branch circuits 310-1 and 310-2 in an output phase of PA 122 of the transmitting system and in an input phase of LNA 151 of the receiving system and providing impedance adjustment circuit 320 between branch circuits 310-1 and 310-2, impedance control section 330 changes the impedance condition of impedance adjustment circuit 320 depending on a normal transmitting/receiving mode or a distortion correction mode. Specifically, in a normal transmitting/receiving mode, by adjusting the impedance to assume the same state as when impedance adjustment circuit 320 is not added, impedance control section 330 prevents loss in transmitting and receiving. In addition, in a distortion correction mode, impedance control section 330 adjust an impedance so as to send back a transmitting signal from the transmitting system to the receiving system through impedance adjustment circuit 320. By this means, in a normal transmitting/receiving mode, radio communication apparatus 300 having a normal transmitting/receiving mode and a distortion correction mode can communicate successfully without influencing a circuit characteristic that includes loss. It is possible to correct distortion by sending back a transmitting signal from the transmitting system to the receiving system in a distortion correction mode and extracting a distortion component due to narrowband characteristics or non-linear characteristics of a circuit.

For example, in a configuration where impedance adjustment circuit 320 uses a transistor, impedance adjustment circuit 320 controls a transistor on and off depending on a normal transmitting/receiving mode or a distortion correction mode, and by this means switches the impedance.

Impedance adjustment circuit 320 has PA 321, input transmission line 322, output transmission line 323, and one of input transmission line 322 and output transmission line 323 or both are arranged to earth between PA 321 and one of branch circuit 310-1 and branch circuit 310-2 or both. By adjusting the length of input transmission line 322, it is possible to adjust the characteristic impedance of input impedance of when transistor 324 is in an OFF state, without applying one of gate bias and drain bias impedance or both.

Furthermore, impedance control section 330 switches a transistor on and off and adjusts a bias condition of one of drain terminal 325 and gate terminal 326 of transistor 324 or both, so that it is possible to change a gain of PA 321. Since it is possible to change the strength of a signal to be sent back from the transmitting system to the receiving system by adjusting a bias condition, it is possible to correct distortion in each state where PA 122 or LNA 151 is operated by using a high gain mode or a low gain mode.

Although a configuration where impedance adjustment circuit 320 has PA 321 as a component has been explained above, this is by no means limiting, and impedance adjustment circuit 320 may be formed, for example, by using a switch. Since impedance control section 330 can change the impedance condition by turning switches on and off, it is possible to suit both a normal transmitting/receiving mode and a distortion correction mode.

Although a configuration where input transmission line 322 and output transmission line 323 are inserted between branch circuits 310-1 and 310-2 and PA 321 in series has been explained above, it is equally possible, for example, to arrange input transmission line 322 (output transmission line 323) between branch circuit 310-1 (310-2) and PA 321 to earth as an open stub or a short stub. In this configuration, the same effect can be also achieved.

Although a configuration where branch circuits 310-1 and 310-2 are arranged after PA 122 and before LNA 151 has been explained above, this is by no means limiting. For example, when PA 122 or LNA 151 has enough wideband characteristics and linear characteristics in a system, and radio transmitting processing section 121 and radio receiving processing section 152 requires distortion correction, it is equally possible to arrange branch circuit 310-1 between radio transmitting processing section 121 and PA 122, and arrange branch circuit 310-2 between LNA 151 and radio receiving processing section 152.

Figure 11:
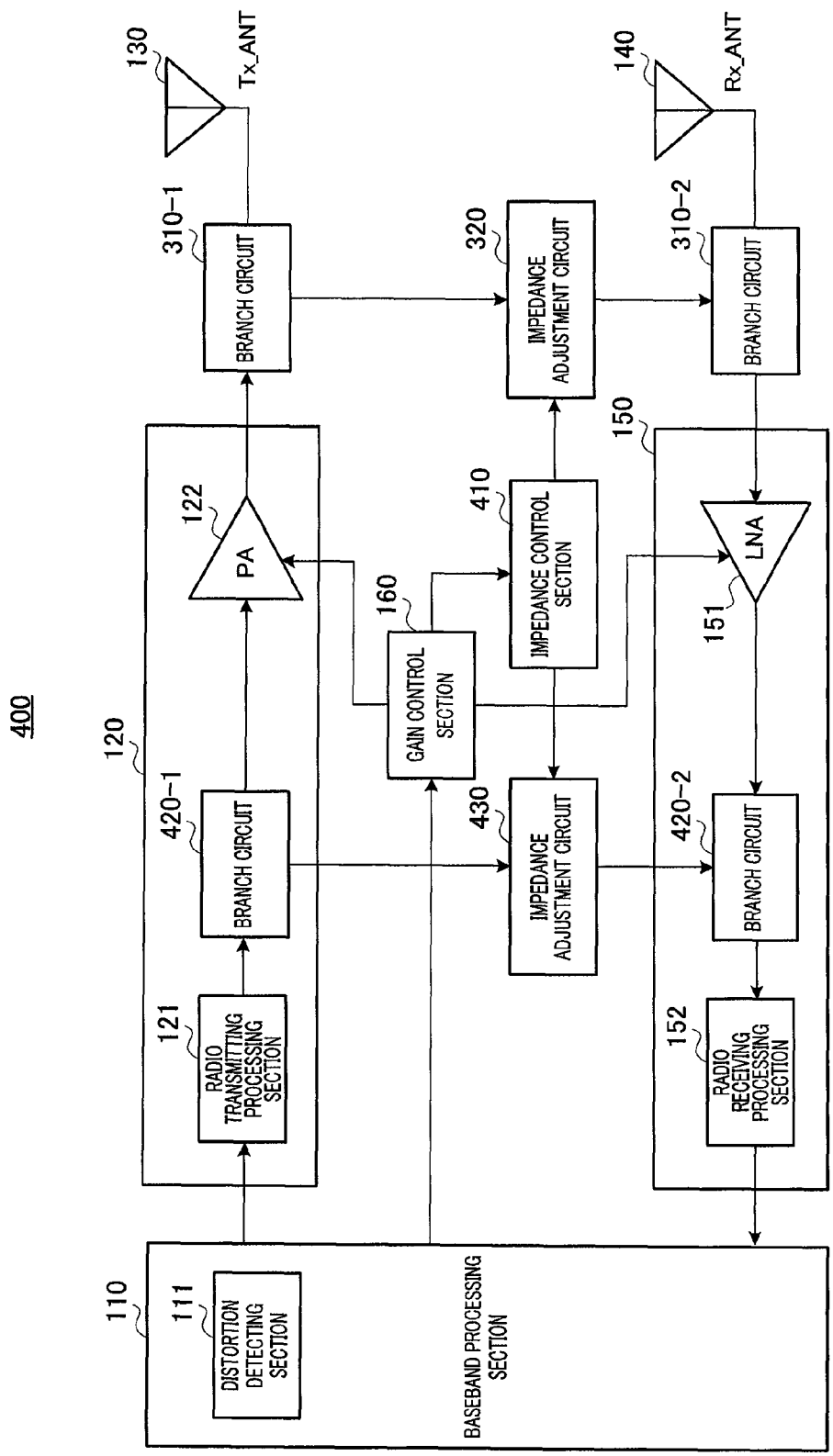
FIG. 11 shows one example of a radio communication apparatus according to embodiment 3.

Furthermore, as shown in FIG. 11, in addition to branch circuits 310-1 and 310-2, a configuration to newly arrange branch circuit 420-1 between radio transmitting processing section 121 and PA 122, arrange branch circuit 420-2 between LNA 151 and radio receiving processing section 152, and add impedance adjustment circuit 430 between branch circuits 420-1 and 420-2, is equally possible. By this means, since this can create two returning paths from the transmitting system to the receiving system, there is an advantage, for example, that it is possible to separate distortion components into radio transmitting processing section 121 and PA 122 or to separate distortion components into LNA 151 and radio receiving processing section 152.

The disclosure of Japanese Patent Application No.2010-045479, filed on Mar. 2, 2010, including the specification, drawings and abstract, is incorporated herein by reference in its entirety.

Industrial Applicability

A radio communication apparatus and radio communication method according to the present invention is useful, for example, as a radio communication apparatus in a radio communication system where receiving power changes depending on changes of distance between transmitting/receiving of, for example, short-range radio communication using a millimeter waveband.

Reference Signs List 100, 200, 300, 400 RADIO COMMUNICATION APPARATUS
110 BASEBAND PROCESSING SECTION
111 DISTORTION DETECTING SECTION
120 TRANSMITTING CIRCUIT
121 RADIO TRANSMITTING PROCESSING SECTION 122 POWER AMPLIFIER (PA)
130, 210 TRANSMITTING ANTENNA (Tx_ANT)
140 RECEIVING ANTENNA (Rx_ANT)
150 RECEIVING CIRCUIT
151 LOW NOISE AMPLIFIER (LNA)
152 RADIO RECEIVING PROCESSING SECTION
160 GAIN CONTROL SECTION
170, 230 COUPLING DEGREE CONTROL SECTION
180, 220 COUPLING DEGREE ADJUSTMENT CIRCUIT
181 PASSIVE ELEMENT
182, 183 SWITCH
190 GND
211-1~211-N ANTENNA ELEMENT
221-1~221-N PHASE SHIFTER
310-1, 310-2, 420-1, 420-2 BRANCH CIRCUIT
320, 430 IMPEDANCE ADJUSTMENT CIRCUIT
321 AMPLIFIER
322 INPUT TRANSMISSION LINE
323 OUTPUT TRANSMISSION LINE
324 TRANSISTOR
325 DRAIN TERMINAL
326 GATE TERMINAL
330 IMPEDANCE CONTROL SECTION

The invention claimed is:

1. A radio communication apparatus that has a normal transmitting/receiving mode and a distortion correction mode, the apparatus comprising:
   a transmitting circuit that includes a transmitting processing circuit configured to generate a high frequency signal from a transmitting baseband signal by radio transmitting process and a power amplifier configured to amplify the high frequency signal;
   a transmitting antenna configured to transmit the high frequency signal amplified by the power amplifier;
   a receiving antenna configured to receive the high frequency signal transmitted by the transmitting antenna;
   a receiving circuit that includes a low noise amplifier configured to amplify the high frequency signal received by the receiving antenna and a receiving processing circuit configured to generate a receiving baseband signal by demodulating the high frequency signal amplified by the low noise amplifier;
   a distortion detecting section configured to detect a distortion component using the transmitting baseband signal and the receiving baseband signal;
   an adjustment section arranged between the transmitting antenna and the receiving antenna and configured to adjust a degree of coupling between the transmitting antenna and the receiving antenna, wherein the adjustment section includes a passive element, a ground, and a switch operable to connect the passive element to the ground; and
   a control section configured to close the switch to connect the passive element to the ground, in the normal transmitting/receiving mode, and to open the switch to disconnect the passive element from the ground, in the distortion correction mode.

2. The radio communication apparatus according to claim 1, further comprising a gain control section configured to set a gain in at least one of the power amplifier and the low noise amplifier,
   wherein the control section configured to control the degree of coupling based on the gain set by the gain control section.

3. The radio communication apparatus according to claim 1, wherein:
   the switch is formed by a variable capacitance.

4. The radio communication apparatus according to claim 1 wherein an electric field surface of the transmitting antenna and an electric field surface of the receiving antenna are arranged to face each other.

5. The radio communication apparatus according to claim 1 wherein the transmitting circuit, the receiving circuit, and the switch are formed by a monolithic microwave integrated circuit.

6. The radio communication apparatus according to claim 1, wherein the switch includes two switch elements arranged and operable to connect two ends of the passive element, respectively, to the ground.

7. The radio communication apparatus according to claim 1, wherein the transmitting and receiving antennas are patch antennas.

8. The radio communication apparatus according to claim 1, wherein the transmitting and receiving antennas are dipole antennas.

9. The radio communication apparatus according to claim 1, wherein a magnetic field surface of the transmitting antenna and a magnetic field surface of the receiving antenna are arranged to face each other.

10. The radio communication apparatus according to claim 1, wherein the adjustment section is configured:
    to close the switch to thereby connect the passive element to the ground: (i) in the normal transmitting/receiving mode, and (ii) in the distorting correction mode in case the gain is set high in both of the power amplifier and the low noise amplifier; and
    to open the switch to thereby disconnect the passive element from the ground, in the distorting correction mode in case the gain is set low in either or both of the power amplifier and the low noise amplifier.

11. A radio communication apparatus that has a normal transmitting/receiving mode and a distortion correction mode, the apparatus comprising:
    a transmitting circuit that includes a transmitting processing circuit configured to generate a high frequency signal from a transmitting baseband signal by radio transmitting process and a power amplifier configured to amplify the high frequency signal;
    a transmitting antenna formed by a plurality of antenna elements and configured to transmit the high frequency signal amplified by the power amplifier;
    a receiving antenna configured to receive the high frequency signal transmitted by the transmitting antenna;
    a receiving circuit that includes a low noise amplifier configured to amplify the high frequency signal received by the receiving antenna and a receiving processing circuit configured to generate a receiving baseband signal by demodulating the high frequency signal amplified by the low noise amplifier;
    a distortion detecting section configured to detect a distortion component using the transmitting baseband signal and the receiving baseband signal;
    an adjustment section configured to adjust a degree of coupling between the transmitting antenna and the receiving antenna, wherein the adjustment section is formed by a plurality of phase shifters that are respectively provided between the plurality of antenna elements and the power amplifier; and
    a control section configured to switch the degree of coupling depending on the normal transmitting/receiving mode or the distortion correction mode, the control section being configured to, in the distortion correction mode, adjust directivity of the transmitting antenna to the receiving antenna for directing the high frequency signal transmitted from the transmitting antenna to the receiving antenna by controlling the phases of the plurality of phase shifters.

12. The radio communication apparatus according to claim 11, wherein the transmitting antenna is formed by N number of antenna elements and the adjustment section is formed by N number of phase shifters, and the N number of phase shifters respectively control phases of signals inputted to the N number of antenna elements.

13. The radio communication apparatus according to claim 12, wherein N is four.

14. The radio communication apparatus according to claim 11, wherein the control section is configured to determine phases for the plurality of phase shifters based on a gain set in at least one of the power amplifier and the low noise amplifier.

15. A radio communication method that is applied to a radio communication apparatus to have a normal transmitting/receiving mode and a distortion correction mode, the method comprising:

generating a high frequency signal from a transmitting baseband signal by radio transmitting process;

generating a transmitting signal by amplifying the high frequency signal;

transmitting the transmitting signal via a transmitting antenna;

receiving the transmitting signal via a receiving antenna and outputting it as a received signal;

amplifying the received signal;

generating a receiving baseband signal by demodulating the amplified received signal;

detecting a distortion component using the transmitting baseband signal and the receiving baseband signal;

adjusting a degree of coupling between the transmitting antenna and the receiving antenna by using an adjustment section arranged between the transmitting antenna and the receiving antenna, the adjustment section including a passive element, a ground, and a switch operable to connect the passive element to the ground;

closing the switch to connect the passive element to the ground, in the normal transmitting/receiving mode; and opening the switch to disconnect the passive element from the ground, in the distortion correction mode.

16. The radio communication method according to claim 15, wherein the step of adjusting includes adjusting the degree of coupling based on at least one of a gain used in the amplifying of the high frequency signal and a gain used in the amplifying of the received signal.

17. The radio communication method according to claim 15, wherein the switch s formed by a variable capacitance.

18. The radio communication method according to claim 15, wherein the step of adjusting includes:

closing the switch to thereby connect the passive element to the ground: (i) in the normal transmitting/receiving mode, and (ii) in the distorting correction mode in case a high gain is used in the amplifying of both of the high frequency signal and the received signal; and opening the switch to thereby disconnect the passive element from the ground, in the distortion correction mode in case a low gain is used in either or both of the amplifying of the high frequency signal and the amplifying of the received signal.

* * * * *